United States Patent
Chen et al.

(10) Patent No.: US 10,645,785 B2
(45) Date of Patent: May 5, 2020

(54) ILLUMINATION DUMMY MODULE

(71) Applicant: GIGA-BYTE TECHNOLOGY CO., LTD., New Taipei (TW)

(72) Inventors: Hung-Cheng Chen, New Taipei (TW); Tse-Hsien Liao, New Taipei (TW); Chen-Te Hsu, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/120,310

(22) Filed: Sep. 3, 2018

(65) Prior Publication Data
US 2019/0335570 A1    Oct. 31, 2019

(30) Foreign Application Priority Data

Apr. 26, 2018    (TW) .............................. 107114339 A

(51) Int. Cl.
*H05B 47/16* (2020.01)
*F21V 23/00* (2015.01)
(Continued)

(52) U.S. Cl.
CPC ........... *H05B 47/16* (2020.01); *F21V 23/005* (2013.01); *G06F 13/4022* (2013.01);
(Continued)

(58) Field of Classification Search
CPC ........ G06F 3/0601; G06F 13/38; G06F 13/40; G06F 13/4004; G06F 13/4022;
(Continued)

(56) References Cited

U.S. PATENT DOCUMENTS 5,805,903 A    9/1998    Elkhoury
6,665,736 B1    12/2003    Fan
(Continued)

FOREIGN PATENT DOCUMENTS

CN    106649048 A       5/2017
GB    2544582 A    *  5/2017
(Continued)

OTHER PUBLICATIONS

Hagendoorn, Hilbert. "Corsair Vengeance RGB DDR4 memory review—A double data-rate introduction". The Guru of 3D. Online Mar. 21, 2017. Retrieved from Internet May 16, 2019. <https://www.guru3d.com/articles-pages/corsair-vengeance-rgb-ddr4-memory-review,1.html>. (Year: 2017).*
(Continued)

*Primary Examiner* — Thomas J. Cleary
(74) *Attorney, Agent, or Firm* — Idea Intellectual Limited; Margaret A. Burke; Sam T. Yip

(57) ABSTRACT

An illumination dummy module is adapted for covering and protecting a card slot and includes a circuit board, a power pin, a clock pin, a data pin, at least one light source, a power converter, and a drive circuit. The circuit board includes an insertion part for inserting into the card slot. The power pin, the clock pin and the data pin are disposed to the insertion part, and the light source is disposed on the circuit board. The power converter receives input power from the card slot via the power pin, and converts the input power into output power. The drive circuit is disposed on the circuit board, and receives the output power from the power converter. The drive circuit also respectively receives a clock signal and a control command via the clock pin and the data pin, to enable or disable the light source.

7 Claims, 4 Drawing Sheets

(51) Int. Cl.
*G06F 13/40* (2006.01)
*H05K 1/11* (2006.01)
*H05K 1/14* (2006.01)
*H05K 1/18* (2006.01)
*H05B 45/10* (2020.01)
*H05B 45/46* (2020.01)
*F21Y 115/10* (2016.01)

(52) U.S. Cl.
CPC ......... *G06F 13/4068* (2013.01); *H05B 45/10* (2020.01); *H05B 45/46* (2020.01); *H05K 1/117* (2013.01); *H05K 1/141* (2013.01); *H05K 1/181* (2013.01); *F21Y 2115/10* (2016.08); *H05K 2201/044* (2013.01); *H05K 2201/049* (2013.01); *H05K 2201/10106* (2013.01); *H05K 2201/10113* (2013.01)

(58) Field of Classification Search
CPC ............. G06F 13/4063; G06F 13/4068; G06F 13/4291; H05B 33/0827; H05B 33/0845; H05B 37/0281; F21V 23/00; F21V 23/003; F21V 23/004; F21V 23/005; F21V 23/006; H05K 1/117; H05K 1/141; H05K 1/181
See application file for complete search history.

(56) References Cited

U.S. PATENT DOCUMENTS

| | | | | |
|---|---|---|---|---|
| 9,723,697 | B1* | 8/2017 | Cheng | H05B 33/0857 |
| 9,769,893 | B1* | 9/2017 | Wu | H05B 33/0842 |
| 2005/0028068 | A1 | 2/2005 | Larson et al. | |
| 2011/0191503 | A1 | 8/2011 | Kakish | |
| 2013/0054949 | A1 | 2/2013 | Berke | |
| 2016/0212825 | A1* | 7/2016 | Kuo | G06F 3/06 |
| 2016/0239460 | A1* | 8/2016 | Ziakas | G06F 15/7803 |
| 2017/0142827 | A1* | 5/2017 | Cheng | H05K 1/0274 |
| 2017/0185123 | A1* | 6/2017 | Venugopal | G06F 1/26 |
| 2017/0343198 | A1 | 11/2017 | Ning et al. | |
| 2018/0024285 | A1* | 1/2018 | Tseng | G02B 6/0083 |

FOREIGN PATENT DOCUMENTS

| | | | | |
|---|---|---|---|---|
| JP | H0651859 | A | | 2/1994 |
| TW | M456042 | U | | 6/2013 |
| TW | M467098 | U | | 12/2013 |
| TW | 201502737 | A | | 1/2015 |
| TW | M527157 | U | | 8/2016 |
| TW | 201719640 | A | | 6/2017 |
| TW | I592057 | B | | 7/2017 |
| WO | WO-2017015222 | A1* | 1/2017 | H04J 3/0661 |

OTHER PUBLICATIONS

"System Management Bus Specification". Revision 1.1. Dec. 11, 1998. Benchmarq Microelectronics Inc. et al. (Year: 1998).*
Fleming, Sam. "Interfacing I2C* Devices to an Intel® SMBus". Intel Corporation. Jan. 2009. (Year: 2009).*
Office Action issued in corresponding Taiwan patent application dated Nov. 27, 2018.
Search report issued in corresponding European patent application dated Dec. 4, 2018.
Mark Tyson, Geil EVO X RGB DDR4 memory modules launched, HEXUS.net/qadeh7, Feb. 21, 2017 and its English translation.
Office Action issued in corresponding Korean patent application dated May 31, 2019 and its English translation.

* cited by examiner

ILLUMINATION DUMMY MODULE

CROSS-REFERENCE TO RELATED APPLICATION

This non-provisional application claims priority under 35 U.S.C. § 119(a) to Patent Application No. 107114339 filed in Taiwan, R.O.C. on Apr. 26, 2018, the entire contents of which are hereby incorporated by reference.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Technical Field

This disclosure relates to a dummy module and in particular to an illumination dummy module.

Related Art

A dummy card/connector looks identical to a normal card/connector in the configuration, and the dummy card/connector is able to insert into the corresponding card slot; the other type of dummy card/connector is configured as a plug or cover for sealing the opening of the card slot. Usually, a dummy card/connector is not equipped with a functional circuit for electrically connecting to the card slot. The dummy card/connector is used to occupy the idle or prohibited on use card slot, and shields and protects this card slot from being damaged by external objects and dust. The dummy card/connector also prevents this slot from being wrongly used.

Usually the dummy card/connector is made of insulating material and monolithically formed as a single integral piece to plug the opening of the slot or fully cover the whole slot. To a motherboard of a personal computer, hardware resource is enough to support the operations of the slots equipped, idle or prohibited on use slots become sort of redundant components. If the idle or prohibited on use slots can be properly used in other respect, the hardware resource available on the motherboard can be used better.

SUMMARY

This disclosure provides an illumination dummy module that can protect a slot and further illuminates by using power supplied by the motherboard to serve as a light decoration.

The illumination dummy module according to this disclosure is adapted to a motherboard. The motherboard comprises a basic input and output system module and at least one card slot. The card slot at least comprises a power line, a clock line and a data line, and the clock line and the data line are connected to the basic input and output system module. The illumination dummy module comprises a circuit board, a power pin, a clock pin, a data pin, at least one light source, a power converter, and a drive circuit.

The circuit board includes an insertion part extending on an edge of the circuit board, and the insertion part is used for inserting into the card slot. The power pin, the clock pin and the data pin are disposed to the insertion part, and respectively connected to the power line, the clock line and the data line. The light source is disposed on the circuit board. The power converter is disposed on the circuit board, receives input power from the card slot via the power pin and power line, and converts the input power into output power. The drive circuit is disposed on the circuit board, receives the output power from the power converter, and receives a clock signal and a control command from the card slot via the clock pin and the data pin respectively, so as to enable or disable the light source according to the clock signal and the control command.

In one embodiment, the insertion part and the circuit board are monolithically formed as a single integral piece.

In one embodiment, the insertion part is an edge connector.

In one embodiment, relative positions of the power pin, the clock pin, and the data pin are arranged corresponding to the relative positions of the power line, the clock line, and the data line.

In one embodiment, the illumination dummy module further comprises an auxiliary card disposed on the circuit board in a detachable manner, and the light source is disposed on the auxiliary card.

In one embodiment, the clock signal and the control command are issued by the basic input and output system module via the clock line and the data line respectively.

In one embodiment, the drive circuit includes a controller and at least one transistor switch, one end of the transistor switch is connected to the light source, and the other end of the transistor switch is connected to the power converter to receive the output power. The controller switches the transistor switch into a conducting state or a non-conducting state according to the clock signal and the control command.

In one embodiment, the controller uses the clock signal as a reference signal for time-counting, and the controller uses the control command to determine timings to switch the transistor switch.

In one embodiment, the controller has a plurality of control modes, according to setting parameters of each of the control mode the controller enables or disables the at least one light source at different timings, and the control command is used to active one of the control modes.

In one embodiment, the control command includes setting parameters of at least one control mode, the setting parameters include timings to enable and disable the light source, the controller uses the clock signal as a reference signal for time-counting, According to this disclosure, the illumination dummy module receives power from the idle slot, to illuminate as a light decoration, so as to use the hardware resource available on the motherboard better. Furthermore, the illumination dummy module is not equipped with pins for the other data BUS, does not occupy data transition channels or computing resource, and is able to protect the slot as a dummy card in the art.

BRIEF DESCRIPTION OF THE DRAWINGS

The present invention will become more fully understood from the detailed description given herein below for illustration only, and thus not limitative of the present invention, wherein.

DETAILED DESCRIPTION

Figure 1:
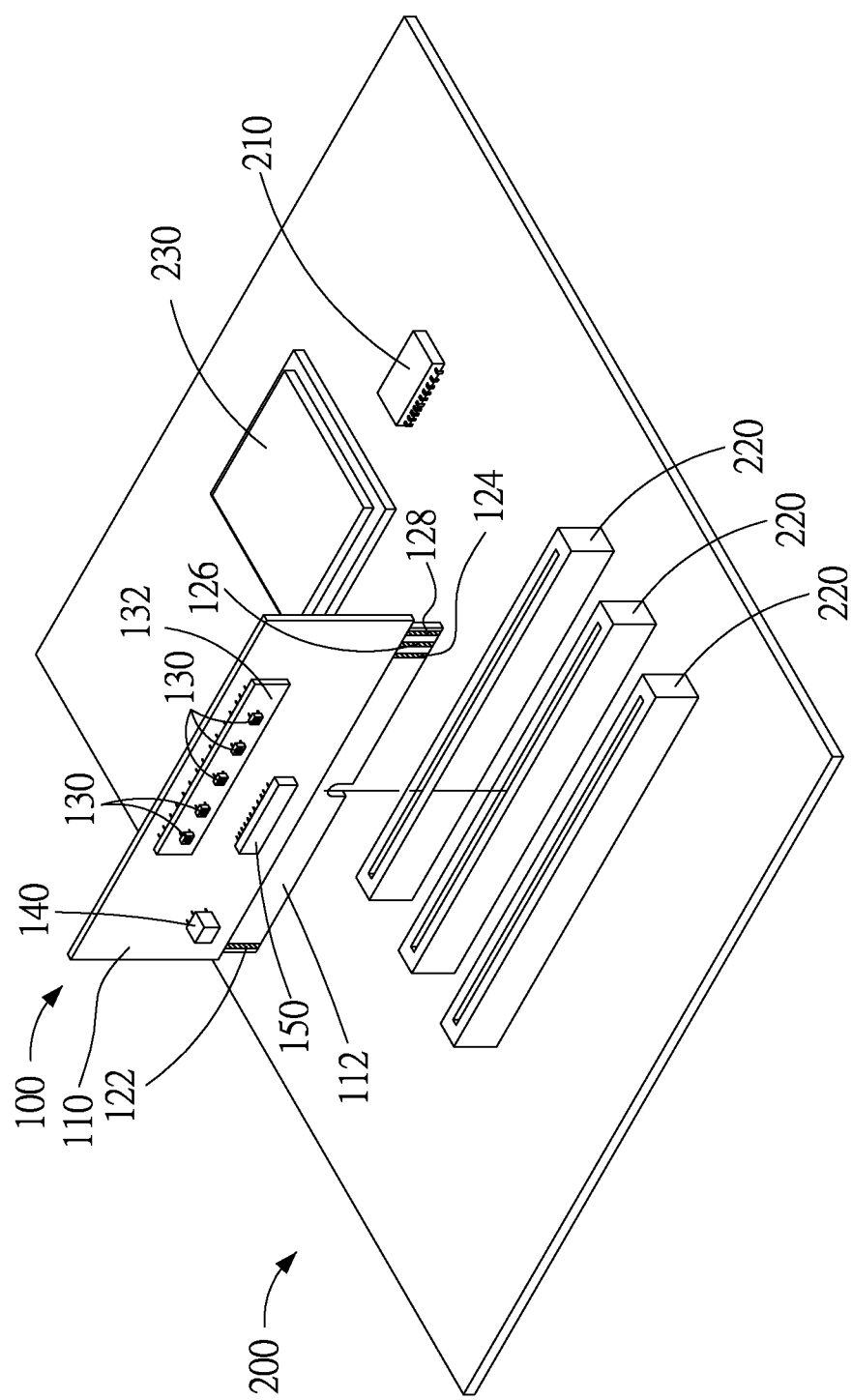
FIG. 1 illustrates a perspective view of the first embodiment.
Figure 2:
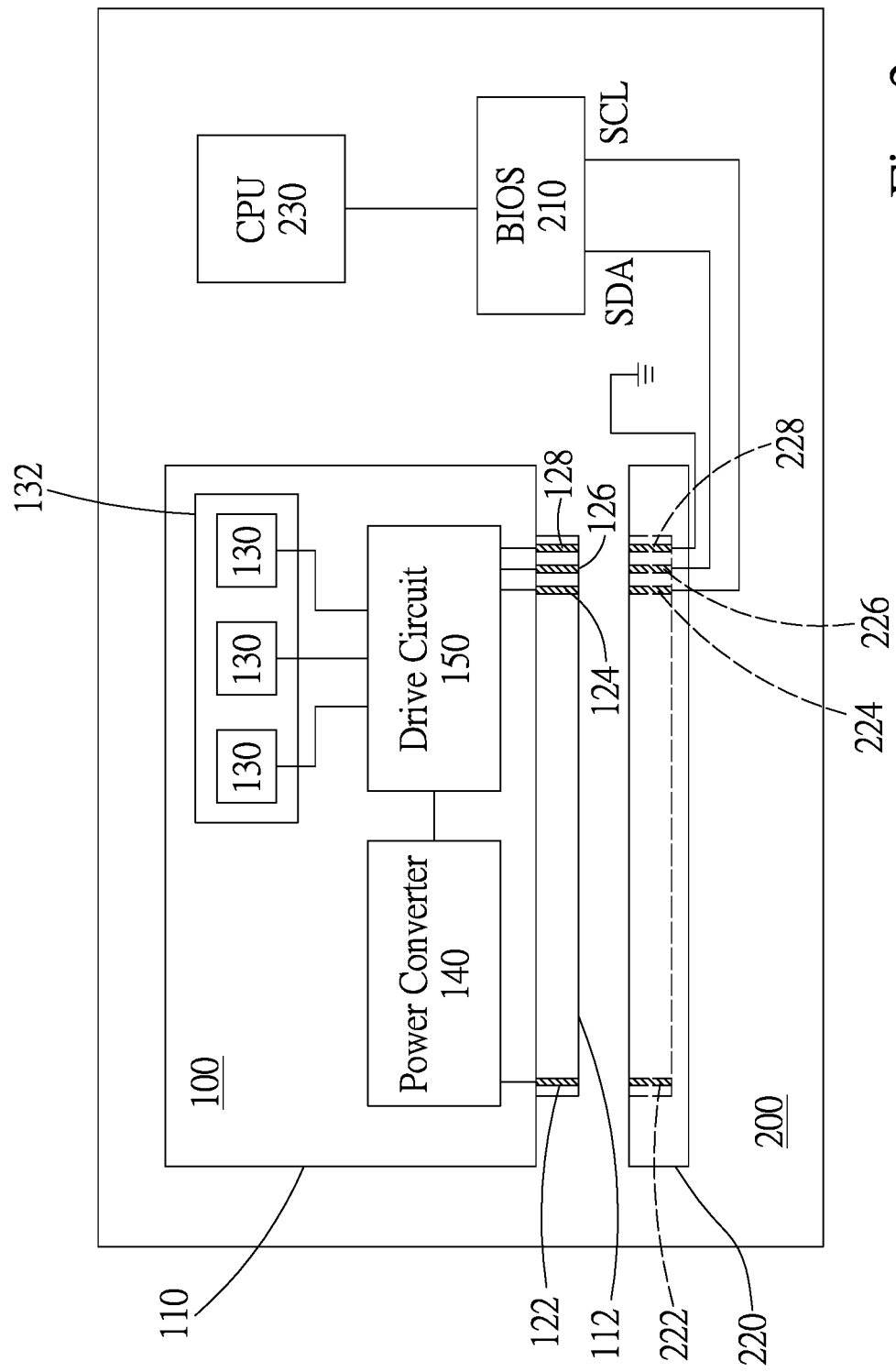
FIG. 2 illustrates a circuit block diagram according to the first embodiment.

Please refer to FIG. 1 and FIG. 2, an illumination dummy module 100 according to a first embodiment is illustrated, which adapted to a motherboard 200. The motherboard 200 comprises a basic input and output system module 210 (BIOS 210) and at least one card slot 220. The motherboard 200 further comprises a central processing unit 230 (CPU 230) and necessarily electronic components (not shown in the drawings) for the motherboard 200. The CPU 230 and the necessarily electronic components are well known in the art and the details will be omitted hereinafter.

As shown in FIG. 2, the card slot 220 at least comprises a power line 222, a clock line 224, a data line 226, and a ground line 228. The clock line 224 and the data line 226 are connected to the BIOS 210. When the card slot 220 is idle, the illumination dummy module 100 inserts into the card slot 220 to protect the card slot 220 from be damaged by external objects. The card slot 220 further comprises the other signal lines for connecting to an ordinary interface card and establishing communication; when the illumination dummy module 100 inserts into the slot 220, these signal lines are not used and covered by the illumination dummy module 100. The motherboard 200 provides input power V1 via the power line 222, outputs a clock signal SCL via the clock line 224, and outputs a control command SDA via the data line 226.

As shown in FIG. 1 and FIG. 2, the illumination dummy module 100 comprises a circuit board 110, a power pin 122, a clock pin 124, a data pin 128, a ground pin 128, one or more light sources 130, a power converter 140, and a drive circuit 150.

As shown in FIG. 1 and FIG. 2, the circuit board 110 is similar to the board of an ordinary interface card, and the printed circuit on the circuit board is simplified. The circuit board 110 includes an insertion part 112 extending on an edge of the circuit board 110, and the insertion part 112 is used for inserting into the card slot 220. The insertion part 112 extends from the circuit board 110 and the insertion part 112 and the circuit board 110 are monolithically formed as a single integral piece. In an example, the insertion part 112 is an edge connector, so called gold finger. In this disclosure, the illumination dummy module 100 is used to protect the card slot 220, and does not has the complex function as the ordinary interface card has. Therefore, the amount of the pins made by electroplating on the insertion part 112 is significantly reduced, only the power pin 122, the clock pin 124, the data pin 126 and the ground pin 128 for light decoration are required, and it is not necessary to dispose other pins on the insertion part 112.

As shown in FIG. 1 and FIG. 2, the power pin 122, the clock pin 124, the data pin 126 and the ground pin 128 are disposed on the insertion part 112. Relative positions of the power pin 122, the clock pin 124, the data pin 126 and the ground pin 128 are arranged corresponding to the relative positions of the power line 222, the clock line 224, the data line 226 and the ground line 228. When the insertion part 112 inserts into the card slot 220, the power pin 122, the clock pin 124, the data pin 126 and the ground pin 128 respectively contact and electrically connect to the power line 222, the clock line 224, the data line 226 and the ground line 228.

As shown in FIG. 1 and FIG. 2, the light source 130 is disposed on the circuit board 110. When plural light sources 130 are disposed, these light sources 130 can disposed in a designated arrangement to form a decoration and respectively emit different color lights. The light source 130 can be but not limited to a light-emitting diode (LED), an organic light-emitting diode (OLED), a small-sized bulb and an electroluminescence device. In an example, plural light sources 130 are disposed on an auxiliary card 132, the auxiliary card 130 is disposed on the circuit board in a detachable manner, so as to replace the plural light sources 130 quickly.

As shown in FIG. 1 and FIG. 2, the power converter 140 is disposed on the circuit board 110, and is electrically connected to the power pin 122. The power converter 140 receives the input power V1 via the power pin 122 and the power line 222, and converts the input power V1 into output power V2. Usually, a DC to DC converter is used to be the power converter 140, and an AC adaptor is an alternative option of the power converter 140. The power converter 140 receives the input power V1 from the card slot 220 via the power line 222 and power pin 122. When the card slot 220 is a PCI Express slot (PCIe Slot), the input power V1 is 3.3 V or 12 V; when the card slot 220 is a DDR SDRAM slot, the input power V1 is reduced to 2.5 V. These voltage values are not always satisfied the requirement of the light source 130, and DC to DC voltage convert is required to convert the input power V1 into the output power V2 that satisfied the requirement of the light source 130.

As shown in FIG. 1 and FIG. 2, the drive circuit 150 is disposed on the circuit board 110 and electrically connected to the power converter 140 and the light source 130. The drive circuit 150 receives the output power from the power converter 140, and drives the light source 130 according to the clock signal SCL and the control command SDA. The drive circuit 150 is electrically connected to the clock pin 124 and the data pin 126 to receive the clock signal SCL and the control command SDA from the card slot 220. The clock signal SCL and the control command SDA are issued by the BIOS 210 and output by the clock line 224 and the data line 226.

Figure 3:
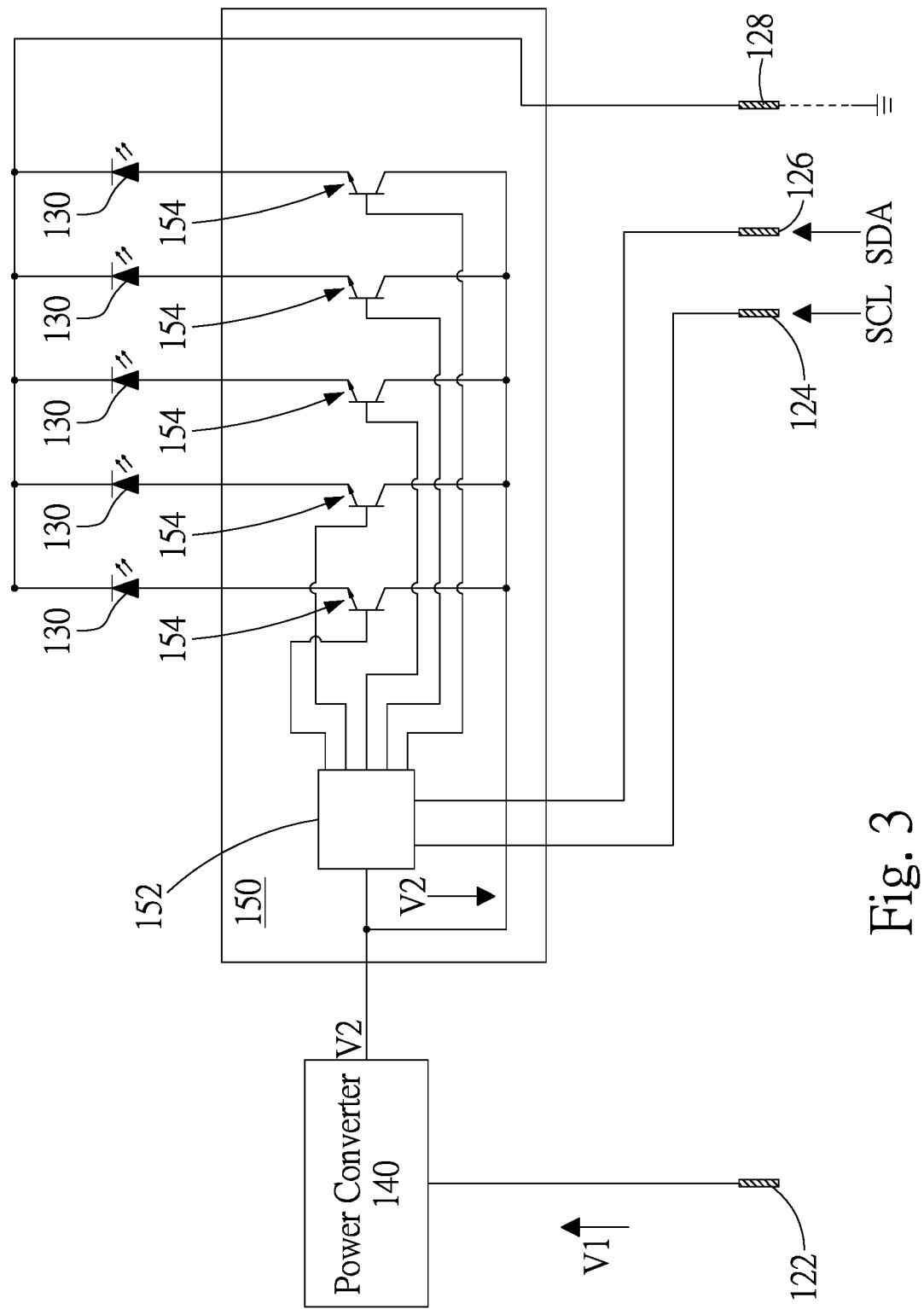
FIG. 3 illustrates a circuit diagram of the drive circuit according to the first embodiment.

As shown in FIG. 3, in an example, the drive circuit includes a controller 152 and a plurality of transistor switches 154. One end of each transistor switch 154 is connected to one of the plural light sources 130, and the other end of each transistor switch 154 is connected to the power converter 140 to receive the output power V2.

According to the clock signal SCL and the control command SDA, the controller 152 switches each of the transistor switches 154 into a conducting state or a non-conducting state, so as to enable or disable corresponding light sources 130. The controller 152 uses the clock signal SCL as a reference signal for time-counting, and the controller 152 uses the control command to determine timings to switch the transistor switches 154. In an example, by programming the firmware or adding an external memory, the controller 152 has a plurality of control modes. According to setting parameters of each of the control mode the controller 152 enables or disables the at least one light source 130 at different timings, and the control command SDA is used to active one of the control modes.

Figure 4:
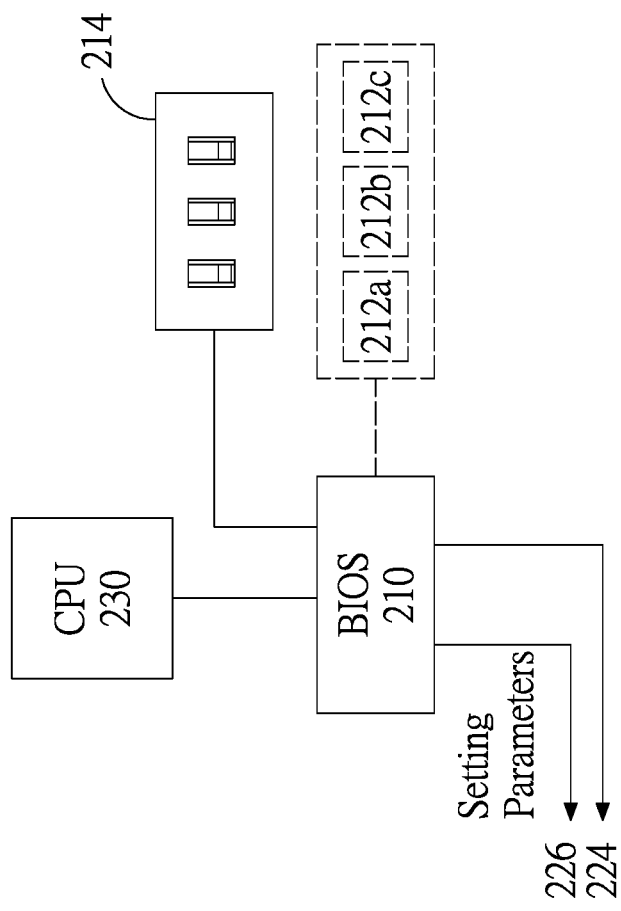
FIG. 4 illustrates a circuit block diagram including part of components according to a second embodiment.

Please refer to FIG. 4, in a second embodiment of this disclosure, the control command SDA includes setting parameters of control modes 212a, 212b, 212c, the setting parameters include timings to enable and disable each of the light sources 130, and the controller 152 uses the clock signal SCL as a reference signal for time-counting. According to setting parameters of each of the control commands SDA the controller 152 enables or disables the at least one light source 130 at different timings. Usually, the setting parameters of the control modes 212a, 212b, 212c are programmed into a code segment in the firmware of the BIOS 210. According to a trigger event, a selection of a switch 214 or a selecting command from CPU 230, the BIOS 210 sends the corresponding setting parameters carried by the control command SDA to the controller 152 of the drive circuit 150 via the data line 226.

Figure 5:
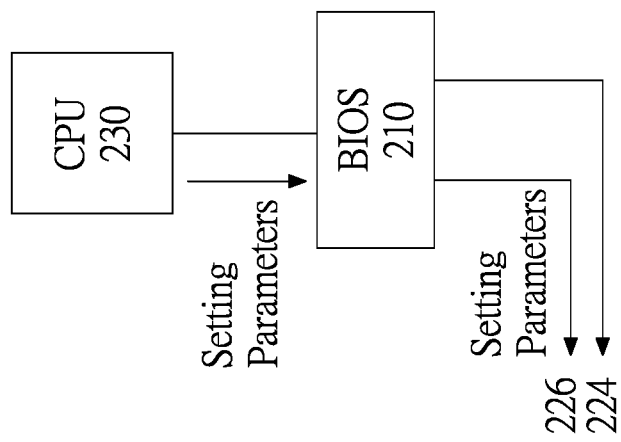
FIG. 5 illustrates a circuit block diagram including part of components according to a third embodiment.

As shown in FIG. 5, in a third embodiment, the setting parameters of the control modes 212a, 212b, 212c are generated by operation system (OS) and transferred to the BIOS 210, and the BIOS 210 transfers the setting parameters carried by the control command SDA to the controller 152 of the drive circuit 150 via the data line 226.

According to this disclosure, the illumination dummy module 100 receives power from the idle card slot 220, to illuminate as a light decoration, so as to use the hardware resource available on the motherboard 200 better. The illumination dummy module 100 is not equipped with pins for the other data BUS, does not occupy data transition channels or computing resource of the motherboard 200, and is able to protect the card slot 220 as a dummy card in the art.

What is claimed is:

1. An illumination dummy module, adapted to a motherboard; wherein the motherboard comprises a basic input and output system module and at least one card slot, the card slot at least comprises a power line, a clock line and a data line, and the clock line, and the data line are connected to the basic input and output system module and a switch is electrically connected to the basic input and output system module; the illumination dummy module comprising:
   a circuit board, including an insertion part extending on an edge of the circuit board; wherein the insertion part is used to insert into the card slot;
   a power pin, a clock pin and a data pin, disposed to the insertion part and respectively connected to the power line, the clock line and the data line;
   at least one light source, disposed on the circuit board;
   a power converter, disposed on the circuit board, receiving input power from the card slot via the power pin and the power line, and converting the input power into an output power; and
   a driver circuit, disposed on the circuit board, for receiving the output power from the power converter, and receiving a clock signal and a control command from the card slot via the clock pin and the data pin respectively; wherein the clock signal and the control command are issued by the basic input and output system module and output by the clock line and the data line;
   wherein the control command includes setting parameters of a plurality of control modes, the setting parameters include timings to enable and disable the at least one light source, and a selection of the switch is used to select the setting parameters of one of the plurality of control modes;
   wherein the driver circuit includes a controller and at least one transistor switch, one end of the transistor switch is connected to the light source, the other end of the transistor switch is connected to the power converter to receive the output power, and the controller uses the clock signal as a reference signal for time-counting and uses the setting parameters of one of the plurality of control modes corresponding to the selection of the switch to determine the timings to switch the transistor switch into a conducting state or a non-conducting state at different timings according to the time-counting and the control command, so as to enable or disable the light source according to the clock signal and the control command.

2. The illumination dummy module as claimed in claim 1, wherein the insertion part and the circuit board are monolithically formed as a single integral piece.

3. The illumination dummy module as claimed in claim 1, wherein the insertion part is an edge connector.

4. The illumination dummy module as claimed in claim 1, wherein the clock signal and the control command are issued by the basic input and output system module via the clock line and the data line respectively.

5. The illumination dummy module as claimed in claim 1, wherein the controller has a plurality of control modes, according to setting parameters of each of the control mode the controller enables or disables the at least one light source at different timings, and the control command is used to activate one of the control modes.

6. The illumination dummy module as claimed in claim 1, wherein the control command includes setting parameters of at least one control mode, the setting parameters include timings to enable and disable the light source, and the controller uses the clock signal as a reference signal for time-counting.

7. An illumination dummy module, adapted to a motherboard; wherein the motherboard comprises a basic input and output system module and at least one card slot, the card slot at least comprises a power line, a clock line and a data line, and the clock line, and the data line are connected to the basic input and output system module and a switch is electrically connected to the basic input and output system module; the illumination dummy module comprising:
   a circuit board, including an insertion part extending on an edge of the circuit board; wherein the insertion part is used to insert into the card slot;
   a power pin, a clock pin and a data pin, disposed to the insertion part and respectively connected to the power line, the clock line and the data line;
   an auxiliary card, disposed on the circuit board in a detachable manner;
   at least one light source, disposed on the auxiliary card;
   a power converter, disposed on the circuit board, receiving input power from the card slot via the power pin and the power line, and converting the input power into an output power; and
   a driver circuit, disposed on the circuit board, for receiving the output power from the power converter, and receiving a clock signal and a control command from the card slot via the clock pin and the data pin respectively; wherein the clock signal and the control command are issued by the basic input and output system module and output by the clock line and the data line;
   wherein the control command includes setting parameters of a plurality of control modes, the setting parameters include timings to enable and disable the at least one light sources, and a selection of the switch is used to select the setting parameters of one of the plurality of control modes;
   wherein the driver circuit includes a controller and at least one transistor switch, one end of the transistor switch is connected to the light source, the other end of the transistor switch is connected to the power converter to receive the output power, and the controller uses the clock signal as a reference signal for time-counting and uses the setting parameters of one of the plurality of control modes corresponding to the selection of the switch to determine the timings to switch the transistor switch into a conducting state or a non-conducting state at different timings according to the time-counting and the control command, so as to enable or disable the light source according to the clock signal and the control command.

* * * * *